(12) United States Patent
Kim et al.

(10) Patent No.: US 7,732,269 B2
(45) Date of Patent: Jun. 8, 2010

(54) METHOD OF ULTRA-SHALLOW JUNCTION FORMATION USING SI FILM ALLOYED WITH CARBON

(75) Inventors: Yihwan Kim, Milpitas, CA (US); Majeed A. Foad, Sunnyvale, CA (US); Yonah Cho, Santa Clara, CA (US); Zhiyuan Ye, San Jose, CA (US); Ali Zojaji, Santa Clara, CA (US); Errol Sanchez, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 333 days.

(21) Appl. No.: 11/742,932

(22) Filed: May 1, 2007

(65) Prior Publication Data

US 2007/0256627 A1 Nov. 8, 2007

Related U.S. Application Data

(60) Provisional application No. 60/796,574, filed on May 1, 2006.

(51) Int. Cl.
H01L 21/336 (2006.01)
H01L 21/8234 (2006.01)
(52) U.S. Cl. .................... 438/197; 257/200
(58) Field of Classification Search ............. 257/288; 438/200, 197
See application file for complete search history.

(56) References Cited

U.S. PATENT DOCUMENTS

| 6,037,640 | A | 3/2000 | Lee |
| 6,043,139 | A | 3/2000 | Eaglesham et al. |
| 6,087,247 | A * | 7/2000 | Downey ............... 438/530 |
| 6,329,088 | B1 | 12/2001 | Landini et al. |
| 6,410,430 | B1 | 6/2002 | Lee et al. |
| 6,462,371 | B1 | 10/2002 | Weimer et al. |
| 6,537,886 | B2 | 3/2003 | Lee |
| 6,803,297 | B2 | 10/2004 | Jennings et al. |
| 6,812,523 | B1 | 11/2004 | Chu et al. |
| 6,893,907 | B2 | 5/2005 | Maydan et al. |
| 6,897,131 | B2 | 5/2005 | Ramachandran et al. |
| 6,972,222 | B2 | 12/2005 | Cho et al. |

(Continued)

OTHER PUBLICATIONS

PCT International Search Report and Written Opinion dated Feb. 22, 2008 for International Application No. PCT/US2007/67806.

(Continued)

*Primary Examiner*—Thao X Le
*Assistant Examiner*—Geoffrey Ida
(74) *Attorney, Agent, or Firm*—Patterson & Sheridan

(57) ABSTRACT

A method for forming an ultra shallow junction on a substrate is provided. In certain embodiments a method of forming an ultra shallow junction on a substrate is provided. The substrate is placed into a process chamber. A silicon carbon layer is deposited on the substrate. The silicon carbon layer is exposed to a dopant. The substrate is heated to a temperature greater than 950° C. so as to cause substantial annealing of the dopant within the silicon carbon layer. In certain embodiments the substrate is heated to a temperature between about 1000° C. and about 1100°. In certain embodiments the substrate is heated to a temperature between about 1030° C. and 1050° C. In certain embodiments, a structure having an abrupt p-n junction is provided.

2 Claims, 6 Drawing Sheets

U.S. PATENT DOCUMENTS

| | | |
|---|---|---|
| 7,132,338 B2 | 11/2006 | Samoilov et al. |
| 7,166,528 B2 | 1/2007 | Kim et al. |
| 2003/0068869 A1 | 4/2003 | Todd |
| 2003/0082882 A1 | 5/2003 | Babcock et al. |
| 2003/0164512 A1* | 9/2003 | Alok et al. ............... 257/288 |
| 2004/0041179 A1* | 3/2004 | Mizushima et al. ......... 257/288 |
| 2004/0072446 A1 | 4/2004 | Liu et al. |
| 2004/0104682 A1 | 6/2004 | Horsky et al. |
| 2004/0161911 A1* | 8/2004 | Chu et al. ............... 438/479 |
| 2004/0171204 A1* | 9/2004 | Slater et al. ............. 438/200 |
| 2004/0245583 A1* | 12/2004 | Horiuchi et al. ........... 257/408 |
| 2005/0079691 A1 | 4/2005 | Kim et al. |
| 2005/0079692 A1* | 4/2005 | Samoilov et al. ........... 438/481 |
| 2005/0093084 A1 | 5/2005 | Wang et al. |
| 2005/0148148 A1 | 7/2005 | Cheng |
| 2006/0017138 A1 | 1/2006 | Ting |
| 2006/0115934 A1 | 6/2006 | Kim et al. |
| 2006/0216876 A1 | 9/2006 | Kim et al. |
| 2006/0220027 A1* | 10/2006 | Takahashi et al. ............. 257/77 |
| 2007/0082451 A1 | 4/2007 | Samoilov et al. |
| 2007/0145377 A1* | 6/2007 | Miura ...................... 257/77 |
| 2007/0207596 A1 | 9/2007 | Kim et al. |

OTHER PUBLICATIONS

Australian Search Report and Written Opinion for Application No. SG 200808049-1 dated Sep. 28, 2009.

* cited by examiner

METHOD OF ULTRA-SHALLOW JUNCTION FORMATION USING SI FILM ALLOYED WITH CARBON

CROSS-REFERENCE TO RELATED APPLICATIONS

This application claims benefit of United States provisional patent application Ser. No. 60/796,574, filed May 1, 2006, which is herein incorporated by reference.

BACKGROUND OF THE INVENTION

1. Field of the Invention

Embodiments of the present invention generally relate to semiconductor devices and methods of fabricating the same, and in particular, to a method of fabricating an ultra-shallow junction in Field Effect Transistor (FET) devices.

2. Description of the Related Art

Ultra-large-scale integrated (ULSI) circuits typically include more than one million transistors that are formed on a semiconductor substrate and which cooperate to perform various functions within an electronic device. Such transistors may include complementary metal-oxide-semiconductor (CMOS) field effect transistors and metal oxide semiconductor field effect transistors (MOSFET).

A CMOS transistor includes a gate structure that is disposed between a source region and a drain region defined in the semiconductor substrate. The gate structure generally comprises a gate electrode formed on a gate dielectric material. The gate electrode controls a flow of charge carriers, beneath the gate dielectric, in a channel region that is formed between the drain region and the source region, so as to turn the transistor on or off. The channel, drain, and source regions are collectively referred to in the art as a "transistor junction". There is a constant trend to reduce dimensions of the transistor junction in order to facilitate an increase in the operational speed of such transistors.

The gate electrode is generally formed of doped polysilicon (Si) while the gate dielectric material may comprise a thin layer (e.g., <20 Å) of a high dielectric constant material (e.g., a dielectric constant greater than 4.0) such as silicon dioxide ($SiO_2$) or N-doped silicon dioxide, and the like.

The CMOS transistor may be fabricated by defining source and drain regions in the semiconductor substrate using an ion implantation process. However, smaller dimensions for the transistor junctions have necessitated the formation of source and drain regions with reduced depths (e.g., depths of between 100 to 500 Å). Such ultra shallow junctions require abrupt interfaces that are difficult to form using ion implantation techniques due to ion-channeling and transient enhanced diffusion phenomena (TED). Dopants experience greatly enhanced diffusion or TED during post-implant annealing due to interaction of the dopants with excess silicon interstitials. This enhanced diffusion results in a deeper source/drain junction and poorer junction profile.

Several methods have attempted to reduce TED during formation of ultra shallow junctions. One method for fabricating the ultra shallow transistor junctions is called carbon co-implantation in which carbon is co-implanted with a dopant such as boron. Although carbon co-implantation is successful in reducing TED, carbon co-implantation suffers from the disadvantage of creating a high number of point defects in the film.

Another method uses fluorine co-implants to reduce TED during annealing. However, this method suffers from the same disadvantages as carbon co-implantation, i.e. point defects remain after annealing.

Therefore, there is a need for an improved method for fabricating an ultra shallow junction of a field effect transistor.

SUMMARY OF THE INVENTION

The present invention generally relates to a method of fabricating an ultra shallow junction of a field effect transistor device. In certain embodiments a method of forming an ultra shallow junction on a substrate is provided. The substrate is placed into a process chamber. A silicon carbon layer is deposited on the substrate. The silicon carbon layer is exposed to a dopant. The substrate is heated to a temperature greater than 950° C. so as to cause substantial annealing of the dopant within the silicon carbon layer. In certain embodiments the substrate is heated to a temperature between about 1000° C. and about 1100°. In certain embodiments the substrate is heated to a temperature between about 1030° C. and 1050° C.

In certain embodiments, a method of forming an ultra shallow junction on a substrate surface is provided. The substrate is placed into a process chamber. An epitaxial silicon carbon layer is deposited on the substrate. A dopant is implanted into the silicon carbon layer. The substrate is heated to a temperature greater than 950° C. In certain embodiments, the dopant is implanted into the silicon carbon layer using a plasma immersion ion implantation process. In certain embodiments, after heating the substrate to a temperature greater than 950° C., an upper portion of the silicon carbon layer has a substitutional carbon concentration less than a substitutional carbon concentration of a lower portion of the silicon carbon layer.

In certain embodiments, a structure having an abrupt p-n junction is provided. The structure comprises a semiconductor substrate. The structure further comprises a source region and a drain region defined by ions implanted in an epitaxially deposited silicon carbon layer. The structure further comprises a channel region with a gate above the channel region, the gate comprising a gate electrode and a dielectric layer. In certain embodiments, the abrupt p-n junction has a dopant profile of about 3 nm/decade.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and embodiments disclosed may be readily utilized as a basis for modifying or designing other structures or processes for carrying out the same purposes of the present invention. It should also be realized by those skilled in the art that such equivalent constructions do not depart form the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention as recited in the claims generally provide a method of forming an ultra shallow junction on a substrate surface. The substrate is placed into a process chamber. A silicon carbon layer is deposited on the substrate surface. The silicon carbon layer is exposed to a dopant. The substrate is heated to a temperature greater than 950° C. so as to cause substantial annealing of the dopant within the silicon carbon layer.

Throughout the application, the terms "silicon-containing" materials, compounds, films or layers should be construed to include a composition containing at least silicon and may contain germanium, carbon, boron, arsenic, phosphorous gallium and/or aluminum. Other elements, such as metals, halogens or hydrogen may be incorporated within a silicon-containing material, compound, film or layer, usually in part per million (ppm) concentrations. Compounds or alloys of silicon-containing materials may be represented by an abbreviation, such as Si for silicon, SiGe, for silicon germanium, SiC for silicon carbon, and SiGeC for silicon germanium carbon. The abbreviations do not represent chemical equations with stoichiometrical relationships, nor represent any particular reduction/oxidation state of the silicon-containing materials.

Figure 1:
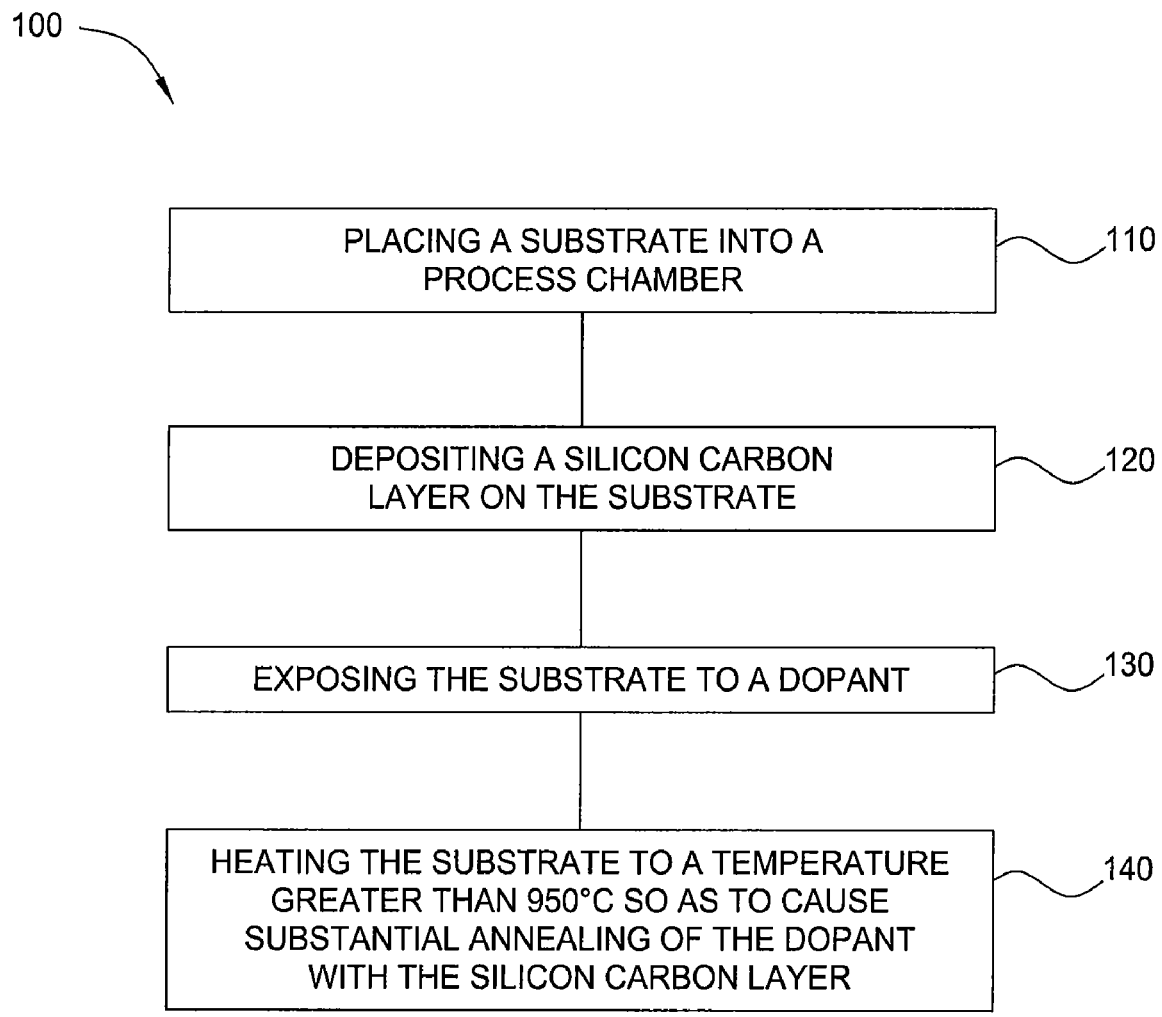
FIG. 1 illustrates an exemplary process sequence for forming an ultra shallow junction on a substrate according to certain embodiments described herein.

FIG. 1 illustrates an exemplary process sequence 100 for forming an ultra shallow junction on a substrate. In step 110 a substrate is placed into a process chamber. In step 120 a silicon carbon layer is deposited on the substrate. In step 130, the silicon carbon layer is exposed to a dopant. In step 140, the substrate is heated to a temperature greater than 950° C. so as to cause substantial annealing of the dopant within the silicon carbon layer.

In step 110 a substrate is placed into a process chamber. The substrate of step 110 can be a patterned substrate. Patterned substrates are substrates that include electronic features formed into or onto the substrate surface. The patterned substrate may contain monocrystalline surfaces and at least one secondary surface that is non-monocrystalline, such as polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

In step 120 a silicon carbon layer is deposited on the substrate. The silicon carbon layer of step 120 may be deposited using an epitaxial process. Generally, the process chamber is maintained at a consistent temperature throughout the epitaxial process. However, some steps may be performed at varying temperatures. The process chamber is kept at a temperature in the range from about 250° C. to about 1,000° C., preferably from about 500° C. to about 800° C. and more preferably from about 550° C. to about 750° C. The appropriate temperature to conduct the epitaxial process may depend on the particular precursors used to deposit and/or etch the silicon-containing materials. In one example, it has been found that chlorine ($Cl_2$) gas works exceptionally well as an etchant for silicon-containing materials at temperatures lower than processes using more common etchants. Therefore, in one example, a preferred temperature to pre-heat the process chamber is about 750° C. or less, preferably about 650° C. or less and more preferably about 550° C. or less. The process chamber is usually maintained at a pressure from about 0.1 Torr to about 200 Torr, preferably from about 1 Torr to about 50 Torr. The pressure may fluctuate during and between this deposition step, but is generally constant.

During the deposition process of step 120, the substrate is exposed to a deposition gas to form an epitaxial layer on the monocrystalline surface while forming a polycrystalline layer on the secondary surfaces. The substrate is exposed to the deposition gas for a period of time of about 0.5 seconds to about 30 seconds, preferably from about 1 second to about 20 seconds, and more preferably from about 5 seconds to about 10 seconds. The specific exposure time of the deposition process is determined in relation to the exposure time during the etching process, as well as particular precursors and temperature used in the process. Generally, the substrate is exposed to the deposition gas long enough to form a maximized thickness of an epitaxial layer while forming a minimal thickness of a polycrystalline layer that may be easily etched away during deposition step 120.

The deposition gas contains at least a silicon source, a carrier gas, and a carbon source. In certain embodiments, the deposition gas may include at least one etchant, such as hydrogen chloride or chlorine.

The silicon source is usually provided into the process chamber at a rate in a range from about 5 sccm to about 500 sccm, preferably from about 10 sccm to about 300 sccm, and more preferably from about 50 sccm to about 200 sccm, for example, about 100 sccm. Silicon sources useful in the deposition gas to deposit silicon-containing compounds include silanes, halogenated silanes, and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where $X'$=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), trimethylsilane (($CH_3$)$_3SiH$)), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Organosilane compounds have been found to be advantageous silicon sources as well as carbon sources in embodiments which incorporate carbon in the deposited silicon-containing compound.

The silicon source is usually provided into the process chamber along with a carrier gas. The carrier gas has a flow rate from about 1 slm (standard liters per minute) to about 100 slm, preferably from about 5 slm to about 75 slm, and more preferably from about 10 slm to about 50 slm, for example, about 25 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process. Usually the carrier gas is the same throughout each step. However, certain embodiments may use different carrier gases in particular steps.

Preferably, nitrogen is utilized as a carrier gas in embodiments featuring low temperature (e.g., <800° C.) processes. Low temperature processes are accessible due in part to the use of chlorine gas in the etching process. Nitrogen remains inert during low temperature deposition processes. Therefore, nitrogen is not incorporated into the deposited silicon-containing material during low temperature processes. Also, a nitrogen carrier gas does not form hydrogen-terminated surfaces as does a hydrogen carrier gas. The hydrogen-terminated surfaces formed by the adsorption of hydrogen carrier gas on the substrate surface inhibit the growth rate of silicon-containing layers. Finally, the low temperature processes may take economic advantage of nitrogen as a carrier gas, since nitrogen is far less expensive than hydrogen, argon or helium.

The carbon source provided to the process chamber during step 120 with the silicon source and carrier gas to form a silicon-containing compound, such as a silicon carbon material is usually provided into the process chamber at a rate in the range from about 0.1 sccm to about 20 sccm, preferably from about 0.5 sccm to about 10 sccm, and more preferably from about 1 sccm to about 5 sccm, for example, about 2 sccm. Carbon sources useful to deposit silicon-containing compounds include organosilanes, alkyls, alkenes and alkynes of ethyl, propyl and butyl. Such carbon sources include methylsilane ($CH_3SiH_3$), dimethylsilane (($CH_3)_2SiH_2$), trimethylsilane (($CH_3)_3SiH$)), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 at. %, preferably from about 1 at. % to about 3 at. %, for example 1.5 at. %. In certain embodiments, the carbon concentration may be graded within an epitaxial layer, preferably graded with a higher carbon concentration in the lower portion of the epitaxial layer than in the upper portion of the epitaxial layer. Alternatively, a germanium source and a carbon source may both be added during step 120 into the process chamber with the silicon source and carrier gas to form a silicon-containing compound, such as a silicon germanium carbon material.

The deposition process is terminated. In one example, the process chamber may be flushed with a purge gas or the carrier gas and/or the process chamber may be evacuated with a vacuum pump. The purging and/or evacuating processes remove excess deposition gas, reaction by-products and other contaminates. In another example, once the deposition process has terminated, the etching process is immediately started without purging and/or evacuating the process chamber.

An optional etching process may be performed. The etching process removes silicon-containing materials deposited during step 120 from the substrate surface. The etching process removes both epitaxial or monocrystalline materials and amorphous or polycrystalline materials. Polycrystalline layers, if any, deposited on the substrate surface are removed at a faster rate than the epitaxial layers. The time duration of the etching process is balanced with the time duration of the deposition process to result in net deposition of the epitaxial layer selectively formed on desired areas of the substrate. Therefore, the net result of the deposition process in step 120 and etching process to form selective and epitaxially grown silicon-containing material while minimizing, if any, growth of polycrystalline silicon-containing material.

During the etching process, the substrate is exposed to the etching gas for a period of time in the range from about 1 second to about 90 seconds, preferably, from about 2 seconds to about 30 seconds, and more preferably from about 4 seconds to about 10 seconds. The etching gas includes at least one etchant and a carrier gas. The etchant is usually provided into the process chamber at a rate in the range from about 10 sccm to about 700 sccm, preferably from about 50 sccm to about 500 sccm, and more preferably from about 100 sccm to about 400 sccm, for example, about 200 sccm. The etchant used in the etching gas may include chlorine ($Cl_2$), hydrogen chloride (HCl), boron trichloride ($BCl_3$), methylchloride ($CH_3Cl$), carbon tetrachloride ($CCl_4$), chlorotrifluoride ($ClF_3$) and combinations thereof. Preferably, chlorine or hydrogen chloride is used as the etchant.

The etchant is usually provided into the process chamber with a carrier gas. The carrier gas has a flow rate in the range from about 1 slm to about 100 slm, preferably from about 5 slm to about 75 slm, and more preferably from about 10 slm to about 50 slm, for example, about 25 slm. Carrier gases may include nitrogen ($N_2$), hydrogen ($H_2$), argon, helium and combinations thereof. In some embodiment, an inert carrier gas is preferred and includes nitrogen, argon, helium and combinations thereof. A carrier gas may be selected based upon specific precursor(s) and/or temperature used during the epitaxial process. The same carrier gas is usually used throughout each of the steps. However, some embodiments may use a different carrier gas during the etching process as used in the deposition process. In certain embodiments, the preferred etchant is chlorine gas, especially when the AGS process is conducted at a low temperature (e.g., <800° C.). For example, an etching gas contains chlorine as an etchant and nitrogen as a carrier gas and is exposed to the substrate surface at a temperature in a range from about 500° C. to about 750° C. In another example, an etching gas containing chlorine and nitrogen is exposed to the substrate surface at a temperature in a range from about 250° C. to about 500° C.

The etching process is terminated. In one example, the process chamber may be flushed with a purge gas or the carrier gas and/or the process chamber may be evacuated with a vacuum pump. The purging and/or evacuating processes remove excess etching gas, reaction by-products and other contaminates. In another example, once the etching process has terminated, the thickness of the epitaxial layer is immediately started without purging and/or evacuating the process chamber.

The thicknesses of the epitaxial layer and the polycrystalline layer may be determined. If the predetermined thicknesses are achieved, then epitaxial process is terminated. However, if the predetermined thicknesses are not achieved, then the deposition process is repeated as a cycle until the desired thicknesses are achieved. The epitaxial layer is usually grown to have a thickness at a range from about 10 Å to about 2,000 Å, preferably from about 100 Å to about 1,500 Å, and more preferably from about 400 Å to about 1,200 Å, for example, about 800 Å. The polycrystalline layer is usually deposited with a thickness, if any, in a range from an atomic layer to about 500 Å. The desired or predetermined thickness of the epitaxial silicon-containing layer or the polycrystalline silicon-containing layer is specific to a particular fabrication process. In one example, the epitaxial layer may reach the predetermined thickness while the polycrystalline layer is too thick.

In step 130, the silicon carbon film is exposed to a dopant. Typical dopants may include at least one dopant compound to provide a source of elemental dopant, such as boron, arsenic, phosphorous, gallium or aluminum. Dopants provide the deposited silicon-containing compounds with various conductive characteristics, such as directional electron flow in a controlled and desired pathway required by the electronic device. Films of the silicon-containing compounds are doped with particular dopants to achieve the desired conductive characteristic. In certain embodiments, the silicon-containing compound is doped p-type, such as by using diborane to add boron at a concentration in the range from about $10^{15}$ atoms/cm$^3$ to about $10^{21}$ atoms/cm$^3$. In certain embodiments, the p-type dopant has a concentration of at least $5 \times 10^{19}$ atoms/cm$^3$. In certain embodiments, the p-type dopant is in the range from about $1 \times 10^{20}$ atoms/cm$^3$ to about $2.5 \times 10^{21}$ atoms/cm$^3$. In certain embodiments, the silicon-containing compound is doped n-type, such as with phosphorous and/or arsenic to a concentration in the range from about $10^{15}$ atoms/cm$^3$ to about $10^{21}$ atoms/cm$^3$.

A dopant source is usually provided into the process chamber during step 130 at a rate in the range from about 0.1 sccm to about 20 sccm, preferably from about 0.5 sccm to about 10 sccm, and more preferably from about 1 sccm to about 5 sccm, for example, about 2 sccm. Boron-containing dopants useful as a dopant source include boranes and organoboranes. Boranes include borane, diborane ($B_2H_6$), triborane, tetraborane and pentaborane, while alkylboranes include compounds with the empirical formula $R_xBH_{(3-x)}$, where R=methyl, ethyl, propyl or butyl and x=1, 2 or 3. Alkylboranes include trimethylborane (($CH_3)_3B$), dimethylborane (($CH_3)_2BH$), triethylborane (($CH_3CH_2)_3B$) and diethylborane (($CH_3CH_2)_2BH$). Dopants may also include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). Aluminum and gallium dopant sources may include alkylated and/or halogenated derivates, such as described with the empirical formula $R_xMX_{(3-x)}$, where M=Al or Ga, R=methyl, ethyl, propyl or butyl, X=Cl or F and x=0, 1, 2 or 3. Examples of aluminum and gallium dopant sources include trimethylaluminum ($Me_3Al$), triethylaluminum ($Et_3Al$), dimethylaluminumchloride ($Me_2AlCl$), aluminum chloride ($AlCl_3$), trimethylgallium ($Me_3Ga$), triethylgallium ($Et_3Ga$), dimethylgalliumchloride ($Me_2GaCl$) and gallium chloride ($GaCl_3$).

In certain embodiments, the dopants may be introduced via a process such as ion implantation. In certain embodiments, arsenic is implanted between 0.7 keV to 1 keV at a dose of between $5 \times 10^{14}$ and $1 \times 10^{15}$. In certain embodiments, phosphorous is implanted at 1 keV at a dose of between $5 \times 10^{14}$ and $1 \times 10^{15}$. In certain embodiments, boron is implanted at 0.5 keV at a dose of between $5 \times 10^{14}$ and $1 \times 10^{15}$. Ion implantation may be used to form doped regions such as the source and the drain. In the present example, the thickness of the doped regions may be very thin. For example, the thickness of the doped regions may be less than 300 Å. The impurity concentration may be less than or equal to $1 \times 10^{20}$ atoms/cm$^3$ or higher, and the doping dose may be about $1.5 \times 10^{15}$ cm$^{-2}$.

In certain embodiments, the ion implantation may be performed by plasma immersion ion implantation. Plasma immersion ion implantation may include a process wherein an electrode layer may be exposed to a plasma source, while an applied bias may be applied to a substrate. The processing tool to perform plasma immersion ion implantation may include a single and/or batch wafer reactor, wherein direct current (DC) and/or radio frequency (RF) bias may be applied to the substrate. The plasma immersion ion implantation reactor includes a process ambient pressure that may range between 0.01 mTorr and about 1000 Torr. The substrate may be held at a temperature ranging between 150° C. and about 1100° C. High density plasma may be produced by a microwave electron cyclotron resonance (ECR) plasma, a helicon plasma, an inductively coupled plasma, and/or other high density plasma sources. The plasma may comprise Ar, H, N, Xe, O, As, $B_2H_6$, $GeH_4$, P, and/or other sources of the impurity. For example, the helicon plasma may utilize RF powers ranging between about 200 Watts and about 2500 Watts. The applied bias may range between about +200V and about 500V. Other aspects of Plasma Immersion Ion Implantation are discussed in commonly assigned U.S. Pat. No. 6,893,907, issued May 17, 2005, entitled FABRICATION OF SILICON-ON-INSULATOR STRUCTURE USING PLASMA IMMERSION ION IMPLANTATION, which is herein incorporated by reference to the extent it does not conflict with the current specification and claims.

In step 140, an annealing process is performed on the substrate. The annealing process may be carried out for activation and healing damage induced during the ion implantation. The annealing process may include a rapid thermal process, solid phase epitaxy recrystillazation, laser annealing, and or spike annealing. The annealing temperature may depend on the process used. In certain embodiments, the spike anneal is performed at a temperature greater than 950° C. For example, spike annealing may have a temperature ranging between about 1000° C. and about 1100° C., such as between 1030° C. and 1050° C., preferably about 1050° C., while solid phase epitaxy may be performed at 500° C. or less.

In a preferred embodiment, spike annealing is performed in an RTP system capable of maintaining gas pressure in the annealing ambient at a level significantly lower than the atmospheric pressure. An example of such an RTP system is the RADIANCE CENTURA® system commercially available from Applied Materials, Inc., Santa Clara, Calif. Spike annealing is further discussed in commonly assigned U.S. Pat. No. 6,897,131, issued May 24, 2005, entitled ADVANCES IN SPIKE ANNEAL PROCESSES FOR ULTRA SHALLOW JUNCTIONS and commonly assigned U.S. Pat. No. 6,803,297, issued Oct. 12, 2004 entitled OPTIMAL SPIKE ANNEAL AMBIENT, which are herein incorporated by reference to the extent they do not conflict with the current specification and claims.

Figure 2A:
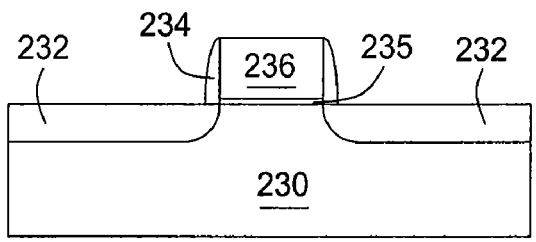
FIGS. 2A-2E illustrates fabrication techniques for source/drain extension device within a MOSFET.
Figure 2B:
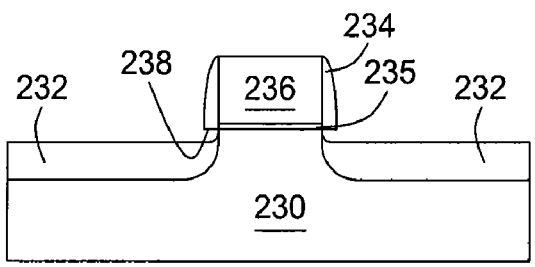

In one example, as depicted in FIGS. 2A-2E, a source/drain extension is formed within a MOSFET device wherein the silicon-containing layers are epitaxially and selectively deposited on the surface of the substrate. FIG. 2A depicts a source/drain region 232 formed by implanting ions into the surface of a substrate 230. The segments of source/drain region 232 are bridged by the gate 236 formed on gate oxide layer 235 and spacer 234. In order to form a source/drain extension, a portion of the source/drain region 232 is etched and wet-cleaned to produce a recess 238, as in FIG. 2B. Etching of the gate 236 may be avoided by depositing a hardmask prior to etching the portion of source/drain region 232.

Figure 2C:
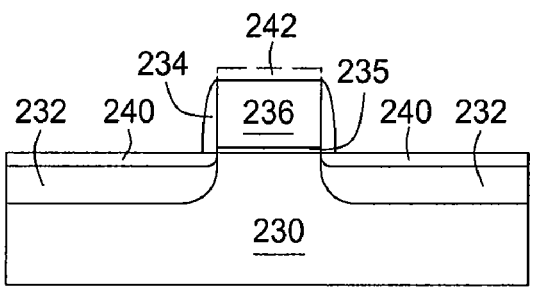

FIG. 2C illustrates one embodiment of an epitaxial process described herein, in which a silicon-containing epitaxial layer 240 and optional polycrystalline layer 242 are simultaneously and selectively deposited without depositing on the spacer 234. Polycrystalline layer 242 is optionally formed on gate 236 by adjusting the deposition and etching processes of the epitaxial process. Alternatively, polycrystalline layer 242 is continually etched away from gate 236 as epitaxial layer 240 is deposited on the source/drain region 232.

In another example, silicon-containing epitaxial layer 240 and polycrystalline layer 242 are SiGe-containing layers with a germanium concentration in a range from about 1 at. % to about 50 at. %, preferably about 24 at. % or less. Multiple SiGe-containing layers containing varying amounts of silicon and germanium may be stacked to form silicon-containing epitaxial layer 240 with a graded elemental concentration. For example, a first SiGe-layer may be deposited with a germanium concentration in a range from about 15 at. % to about 25 at. % and a second SiGe-layer may be deposited with a germanium concentration in a range from about 25 at. % to about 35 at. %.

In another example, silicon-containing epitaxial layer 240 and polycrystalline layer 242 are SiC-containing layers with a carbon concentration in a range from about 200 ppm to about 5 at. %, preferably about 3 at. % or less, preferably, from about 1 at. % to about 2 at. %, for example, about 1.5 at. %. In another embodiment, silicon-containing epitaxial layer 240 and polycrystalline layer 242 are SiGeC-containing layers with a germanium concentration in the range from about 1 at. % to about 50 at. %, preferably about 24 at. % or less and a carbon concentration at about 200 ppm to about 5 at. %, preferably about 3 at. % or less, more preferably from about 1 at. % to about 2 at. %, for example, about 1.5 at. %.

Multiple layers containing Si, SiGe, SiC or SiGeC may be deposited in varying order to form graded elemental concentrations within the silicon-containing epitaxial layer 240. The silicon-containing layers are generally doped with a dopant (e.g., boron, arsenic, phosphoric, gallium or aluminum) having a concentration in the range from about $1 \times 10^{19}$ atoms/cm$^3$ to about $2.5 \times 10^{21}$ atoms/cm$^3$, preferably from about $5 \times 10^{19}$ atoms/cm$^3$ to about $2 \times 10^{20}$ atoms/cm$^3$. Dopants added to individual layers of the silicon-containing material form graded dopants. For example, silicon-containing epitaxial layer 240 is formed by depositing a first SiGe-containing layer with a dopant concentration (e.g., boron) in a range from about $5 \times 10^{19}$ atoms/cm$^3$ to about $1 \times 10^{20}$ atoms/cm$^3$ and a second SiGe-containing layer with a dopant concentration (e.g., boron) in a range from about $1 \times 10^{20}$ atoms/cm$^3$ to about $2 \times 10^{20}$ atoms/cm$^3$.

Carbon incorporated in SiC-containing layers and SiGeC-containing layers is generally located in interstitial sites of the crystalline lattice immediately following the deposition of the silicon-containing layer. The interstitial carbon content is about 10 at. % or less, preferably less than about 5 at. % and more preferably from about 1 at. % to about 3 at. %, for example, about 2 at. %. The silicon-containing epitaxial layer 240 may be annealed to incorporate at least a portion, if not all of the interstitial carbon into substitutional sites of the crystalline lattice. The annealing process may include a spike anneal, such as rapid thermal process (RTP), laser annealing or thermal annealing with an atmosphere of gas, such as oxygen, nitrogen, hydrogen, argon, helium or combinations thereof. The annealing process is conducted at a temperature from about 800° C. to about 1200° C., preferably from about 1050° C. to about 1100° C. The annealing process may occur immediately after the silicon-containing layer is deposited or after a variety of other process steps the substrate will endure.

Figure 2D:
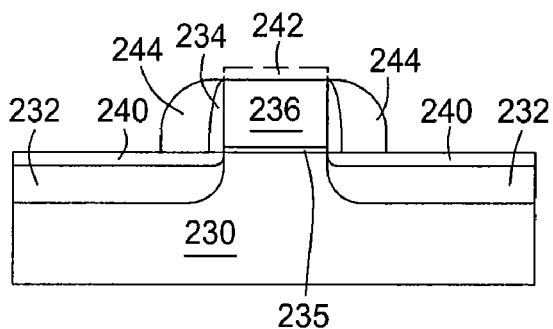

During the next step, FIG. 2D shows a spacer 244, generally a nitride spacer (e.g., Si$_3$N$_4$) deposited on the spacer 234. Spacer 244 is usually deposited in a different chamber by a CVD or ALD technique. Therefore, the substrate is removed from the process chamber that was used to deposit silicon-containing epitaxial layer 240. During the transfer between the two chambers, the substrate may be exposed to ambient conditions, such as the temperature, pressure or the atmospheric air containing water and oxygen. Upon depositing the spacer 244, or performing other semiconductor process (e.g., anneal, deposition or implant), the substrate may be exposed to ambient conditions a second time prior to depositing elevated layer 248. In one embodiment, an epitaxial layer (not shown) with no or minimal germanium (e.g., less than about 5 at %) is deposited on the top of epitaxial layer 240 before exposing the substrate to ambient conditions since native oxides are easier to remove from epitaxial layers containing minimal germanium concentrations than from an epitaxial layer formed with a germanium concentration greater than about 5 at %.

Figure 2E:
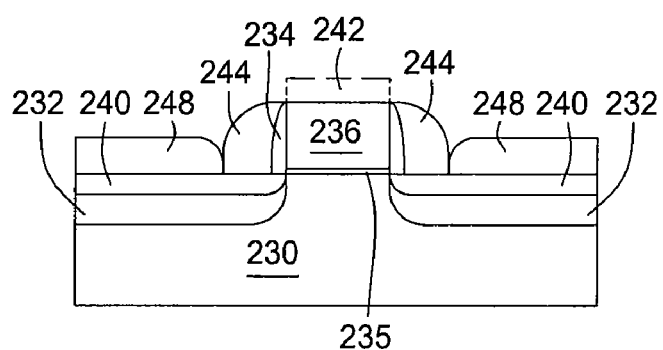

FIG. 2E depicts another example in which an elevated layer 248 comprised of a silicon-containing material is selectively and epitaxially deposited on epitaxial layer 240 (e.g., doped-SiGe). During the deposition process, polycrystalline layer 242 is further grown, deposited or etched away on the gate 236.

In a preferred embodiment, elevated layer 248 is epitaxial deposited silicon containing little or no germanium or carbon. However, in an alternative embodiment, elevated layer 248 does contain germanium and/or carbon. For example, elevated layer 248 may have about 5 at % or less of germanium. In another example, elevated layer 248 may have about 2 at % or less of carbon. Elevated layer 248 may also be doped with a dopant, such as boron, arsenic, phosphorous, aluminum or gallium.

Silicon-containing compounds are utilized within embodiments of the processes to deposit silicon-containing layers used for Bipolar device fabrication (e.g., base, emitter, collector, emitter contact), BiCMOS device fabrication (e.g., base, emitter, collector, emitter contact) and CMOS device fabrication (e.g., channel, source/drain, source/drain extension, elevated source/drain, substrate, strained silicon, silicon on insulator and contact plug). Other embodiments of processes teach the growth of silicon-containing layers that can be used as gate, base contact, collector contact, emitter contact, elevated source/drain and other uses.

Figure 3A:
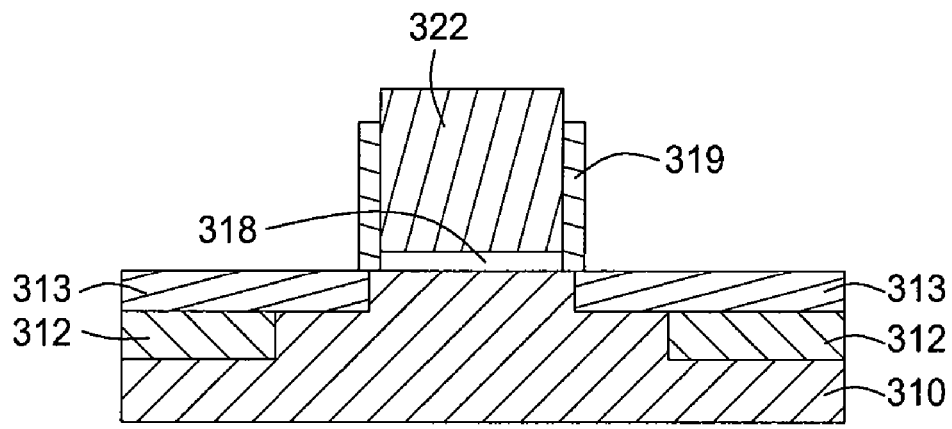
FIGS. 3A-3C illustrates several devices containing selectively and epitaxially deposited silicon-containing layers by applying embodiments described herein.
Figure 3B:
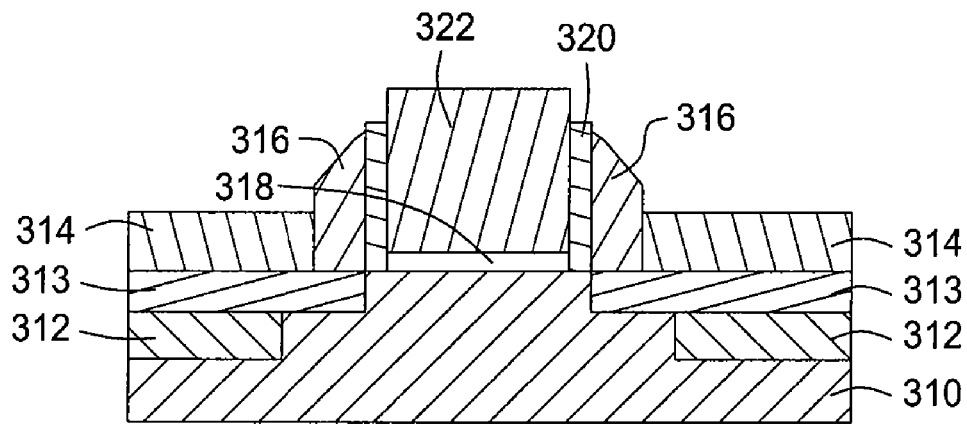
Figure 3C:
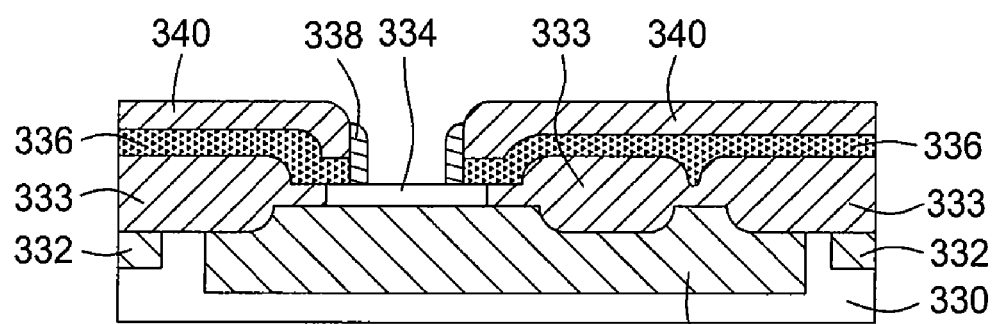

The processes are extremely useful for depositing selective, epitaxial silicon-containing layers in MOSFET and bipolar transistors as depicted in FIGS. 3A-3C. FIGS. 3A-3B shows the epitaxially grown silicon-containing compounds on a MOSFET device. The silicon-containing compound is deposited on the source/drain features of the device. The silicon-containing compound adheres and grows from the crystal lattice of the underlying layer and maintains this arrangement as the silicon-containing compound is grown to a desired thickness. FIG. 3A demonstrates the silicon-containing compound deposited as a recessed source/drain layer, while FIG. 3B shows silicon-containing compounds deposited as recessed source/drain layer and an elevated source/drain layer.

The source/drain region 312 is formed by ion implantation. Generally, the substrate 310 is doped n-type while the source/drain region 312 is doped p-type. Silicon-containing layer 313 is selectively grown on the source/drain region 312 and/or directly on substrate 310. Silicon-containing epitaxial layer 314 is selectively grown on the silicon-containing layer 313 according to aspects herein. A gate oxide layer 318 bridges the segmented silicon-containing layer 313. Generally, gate oxide layer 318 is composed of silicon dioxide, silicon oxynitride or hafnium oxide. Partially encompassing the gate oxide layer 318 is a spacer 316, which is usually an isolation material such as a nitride/oxide stack (e.g., Si$_3$N$_4$/SiO$_2$/Si$_3$N$_4$). Gate layer 322 (e.g., polysilicon) may have a protective layer 319, such as silicon dioxide, along the perpendicular sides, as in FIG. 3A. Alternately, gate layer 322 may have a spacer 316 and off-set layers 320 (e.g., $Si_3N_4$) disposed on either side.

In another example, FIG. 3C depicts the deposited silicon-containing epitaxial layer 334 as a base layer of a bipolar transistor. Silicon-containing epitaxial layer 334 is selectively grown with the various embodiments of the invention. Silicon-containing epitaxial layer 334 is deposited on an n-type collector layer 332 previously deposited on substrate 330. The transistor further includes isolation layer 333 (e.g., $SiO_2$ or $Si_3N_4$), contact layer 336 (e.g., heavily doped poly-Si), off-set layer 338 (e.g., $Si_3N_4$), and a second isolation layer 340 (e.g., $SiO_2$ or $Si_3N_4$).

The processes of the invention can be carried out in equipment known in the art of ALE, CVD and ALD. The apparatus may contain multiple gas lines to maintain the deposition gas and the etching gas separated prior to entering the process chamber. Thereafter, the gases are brought into contact with a heated substrate on which the silicon-containing compound films are grown. Hardware that can be used to deposit silicon-containing films includes the Epi Centura® system and the Poly Gen® system available from Applied Materials, Inc., located in Santa Clara, Calif. An ALD apparatus is disclosed in commonly assigned U.S. Pat. No. 6,916,398, issued Jul. 12, 2005, and entitled, GAS DELIVERY APPARATUS AND METHODS FOR ALD, and is incorporated herein by reference in entirety for the purpose of describing the apparatus. Other apparatuses include batch, high-temperature furnaces, as known in the art.

EXAMPLE 1

A 300 mm bare silicon wafer was placed in a 300 mm Epi Centura® reduced pressure chamber, available from Applied Materials, Inc. of Santa Clara, Calif. An 800 Å thick undoped Si:C epitaxial film was deposited on the 300 mm bare silicon wafer. Phosphorous was implanted at 2 keV and with a dose of $1.5 \times 10^{15}$ $cm^{-2}$ using a Quantum X implanter, available from Applied Materials, Inc. of Santa Clara, Calif. Spike annealing was performed on the silicon wafer at 1050° C. using a Centura RTP, available from Applied Materials, Inc. of Santa Clara, Calif. The processed epitaxial films were characterized by high resolution X-ray diffractometer (HR-XRD) to determine substitutional carbon concentration and thickness. The total carbon (substitutional carbon+interstitial carbon) concentration and phosphorous concentration depth profiles were determined by Secondary Ion Mass Spectroscopy (SIMS). For microstructure study of the epitaxial film, transmission electron microscopy was used.

Figure 4:
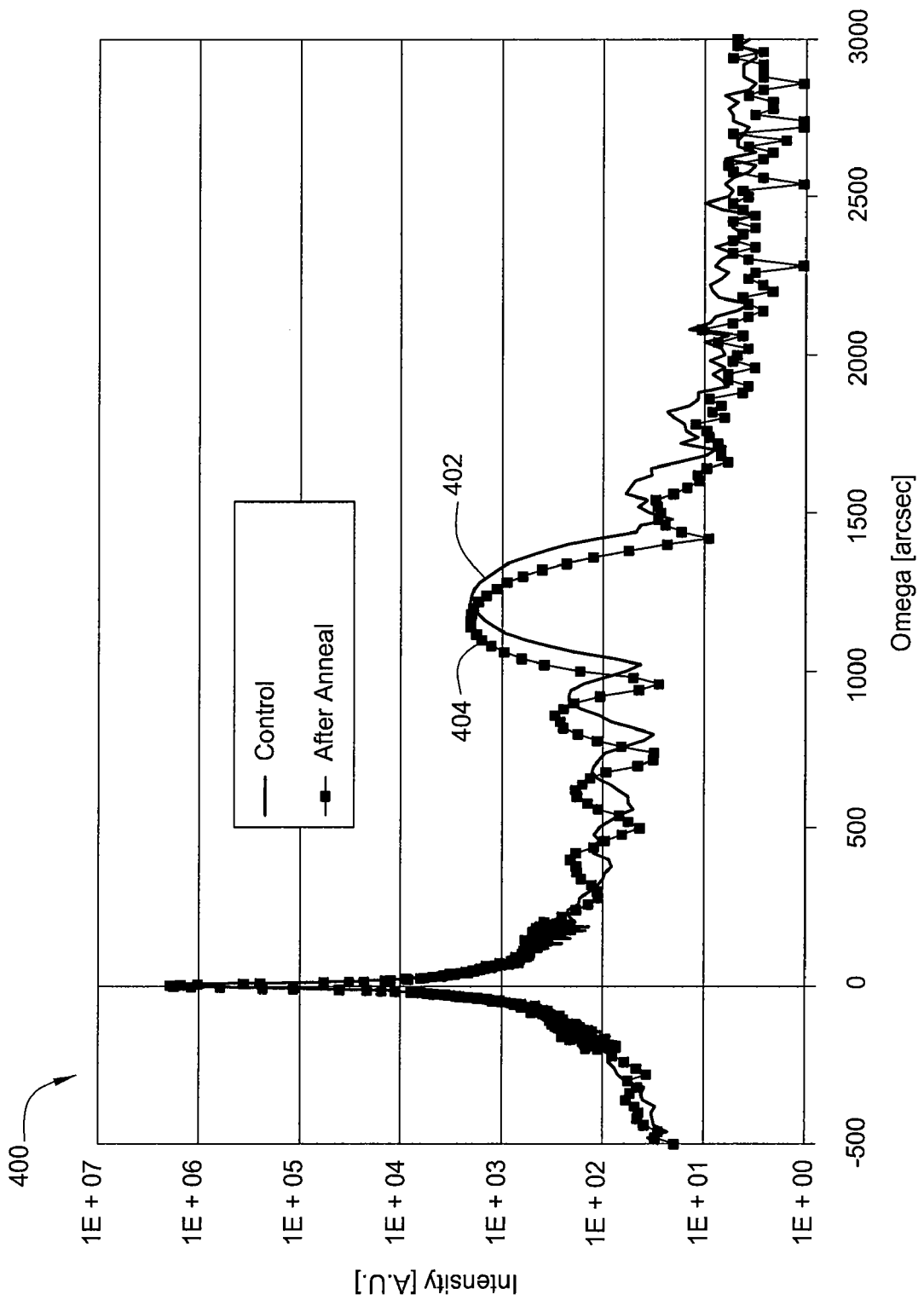
FIG. 4 illustrates a plot of high resolution X-ray diffractometer (HR-XRD) spectra of as-deposited (control) and of spike annealed silicon carbon epitaxial films.

FIG. 4 illustrates a plot 400 of high resolution X-ray diffractometer (HR-XRD) spectra of as-deposited (control) 402 and of spike annealed silicon carbon epitaxial films 404. The x-axis represents Omega [arcsec] and the y-axis represents Intensity [A.U.]. The Si:C is centered at about 1240 arc second on the positive side of the substrate silicon peak, indicating 1.24% of substitutional carbon concentration. Also, multiple thickness fringes indicate high crystallinity of the epitaxial film. A Vegard-like linear interpolation between the lattice parameter of silicon (5.43105 Å) and that of cubic silicon carbide (4.35965 Å) was used to determine substitutional carbon from the XRD result.

The effect of spike annealing on substitutional carbon of the Si:C film is also shown in FIG. 4. From the comparison of two XRD spectra, a decrease of substitutional carbon by 0.06% (corresponding to the peak shift to lower omega by 60 arcsec) can be observed by spike annealing at a temperature of 1050° C. However, no peak broadening was observed. The thickness fringe fitting resulted in the same thickness within errors. This indicates that after annealing, the film maintains its quality with slight substitutional carbon loss.

Figure 5:
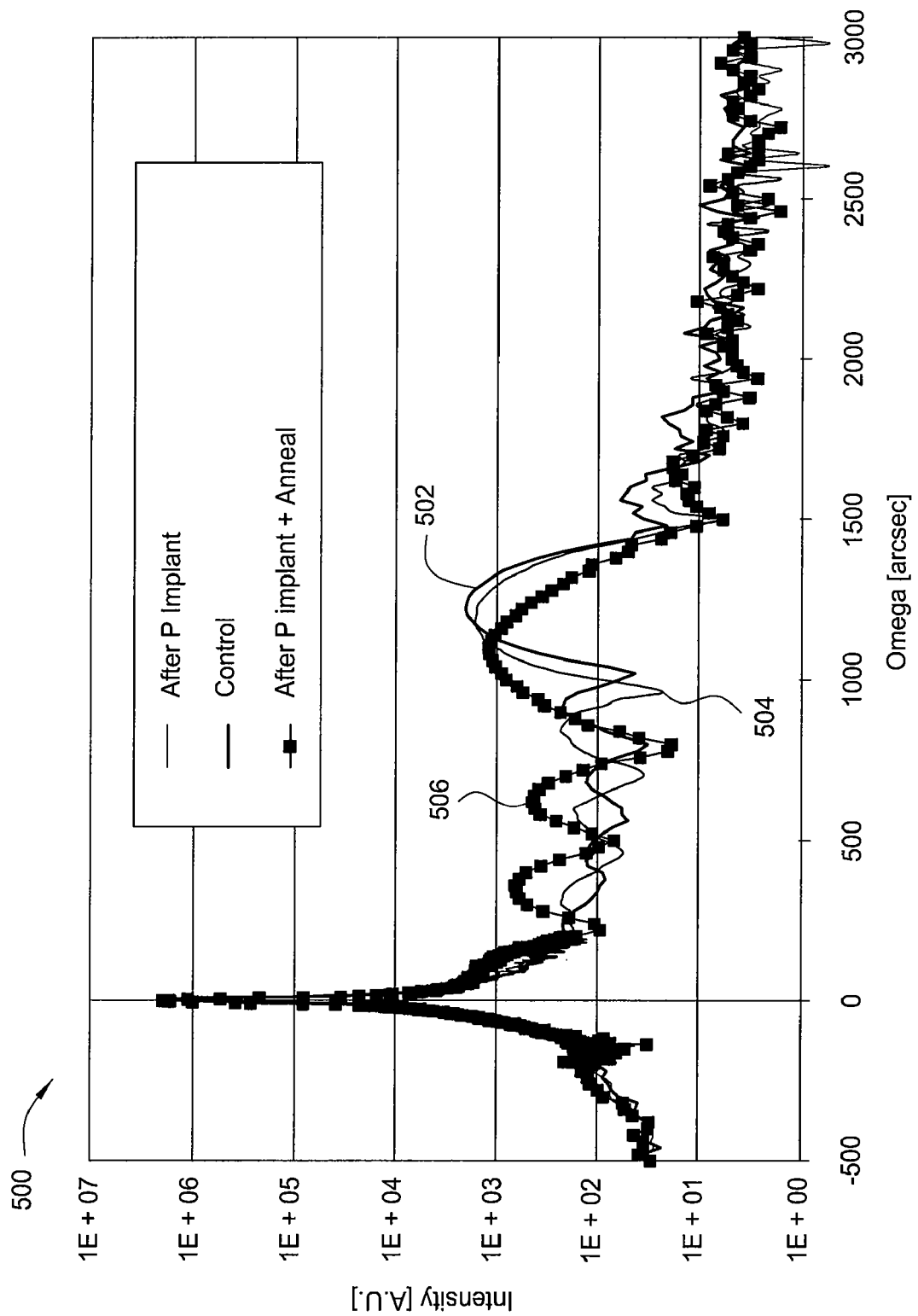
FIG. 5 illustrates a plot of HR-XRD spectra of as-deposited (control), of as-implanted, and of implanted/annealed silicon carbon epitaxial films.

FIG. 5 illustrates a plot 500 of HR-XRD spectra of as-deposited (control) 502, of as-implanted 504, and of implanted/annealed silicon carbon epitaxial films 506. The x-axis represents Omega [arcsec] and the y-axis represents Intensity [A.U.]. For the implanted/annealed sample 504, significant changes can be observed. The peak shifts from 1240" to 1100", with asymmetric peak broadening. Also, thickness fringe peaks are more enhanced in the left side of the Si:C peak and the shoulder peak adjacent to the substrate peak. Since the implantation typically introduces damages in top portion of the layer, a two layer model with different carbon concentration was developed to fit the XRD result. According to the two layer model, the top 300 Å has much lower substitutional carbon (about 0.35%) while the second layer with 560 Å thickness, has substitutional carbon close to 1.24%.

Figure 6:
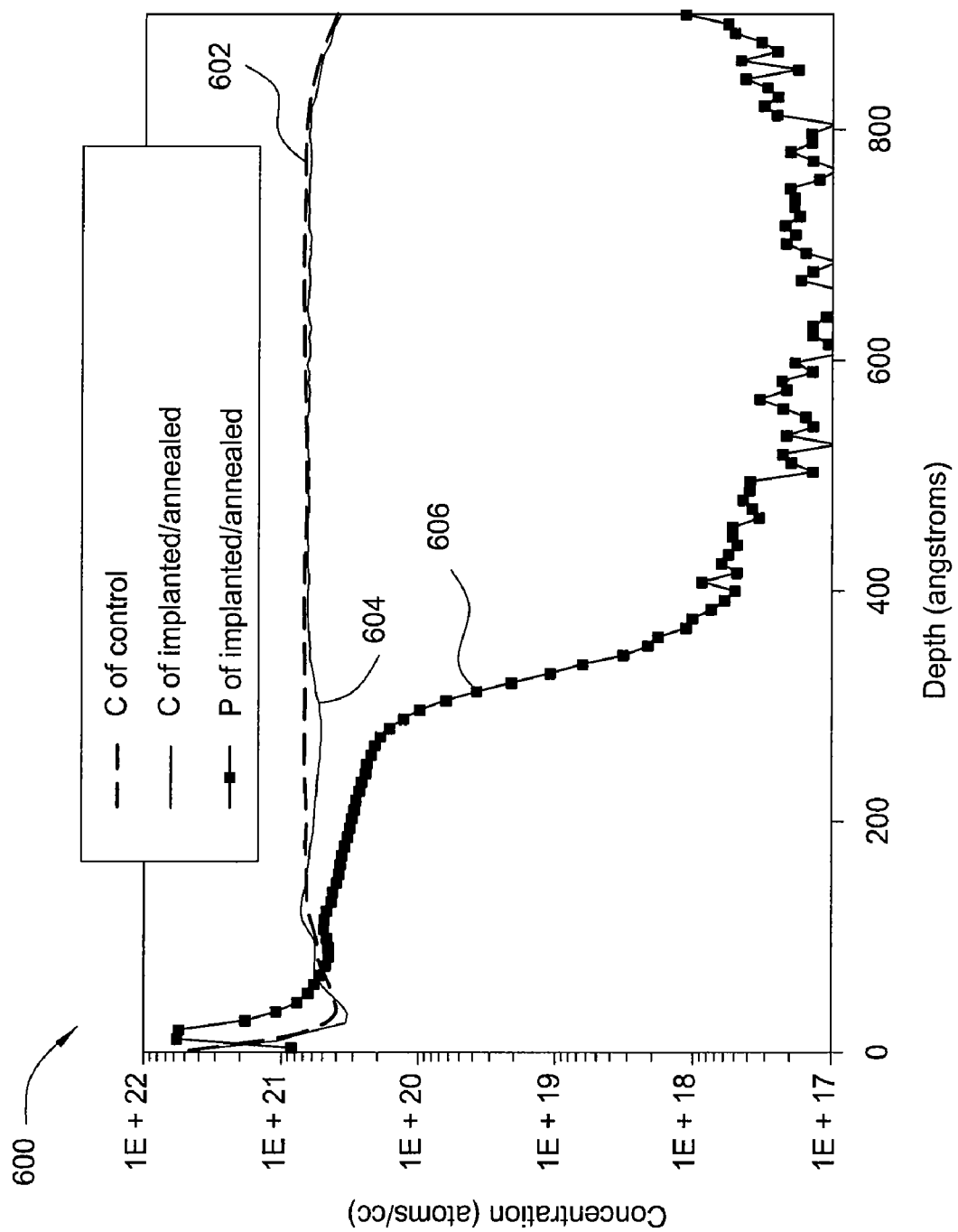
FIG. 6 illustrates a plot of Secondary Ion Mass Spectroscopy (SIMS) depth profiles of carbon and phosphorous of implanted/annealed silicon carbon film.

FIG. 6 illustrates a plot 600 of Secondary Ion Mass Spectroscopy (SIMS) depth profiles of a carbon 604 and phosphorous 606 of implanted/annealed silicon carbon film. A carbon depth profile for a control sample 602 is overlaid for comparison. Total carbon was found to be about 1.3%. This indicated greater than 90% substitutionality. The junction depth at a phosphorous concentration of $1 \times 10^{18}$ $cm^{-3}$ is about 370 Å which is close to the top layer thickness by the above XRD two-layer modeling. Also, the carbon concentration along the depth appears to oscillate slightly within the end-of-range defects caused by the implantation. It is noted that the phosphorous junction profile is as abrupt as 3 nm/decade, indicating significant retardation of phosphorous diffusion in Si:C epitaxial film.

In sum, while spike annealing at a temperature of 1050° C. results in a slight loss of substitutional carbon (0.6%) but maintains high crystallinity, phosphorous implantation induces significant loss of substitutional carbon and a change of carbon depth profile. It is also observed that a very abrupt junction can be formed in a Si:C epitaxial film.

While the foregoing is directed to embodiments of the present invention, other and further embodiments of the invention may be devised without departing from the basic scope thereof, and the scope thereof is determined by the claims that follow.

The invention claimed is:

1. A method of forming an ultra shallow junction on a substrate in a process chamber, the method comprising:
   positioning a substrate comprising a monocrystalline surface and at least one secondary surface that is non-monocrystalline in the process chamber;
   epitaxially depositing a silicon carbon layer on the monocrystalline surface while forming a polycrystalline layer on the secondary surface of the substrate;
   exposing the substrate to an etching gas to remove both epitaxial and polycrystalline layers from the substrate, wherein the polycrystalline layers are removed at a faster rate than the epitaxial layers;
   purging the process chamber of the etching gas;
   repeating the epitaxially depositing a silicon carbon layer on the monocrystalline surface, exposing the substrate to an etching gas, and purging the process chamber of the etching gas until a predetermined thickness of the silicon carbon layer is achieved;
   exposing the substrate to a dopant; and
   heating the substrate to a temperature greater than 950° C. so as to cause substantial annealing of the dopant with the silicon carbon layer to form an ultra shallow junction having a dopant profile of about 3 nm/decade.

2. A method of forming an ultra shallow junction on a substrate in a process chamber, comprising:

providing a substrate comprising a monocrystalline surface and at least one secondary surface that is non-monocrystalline in the process chamber;

depositing an epitaxial silicon carbon layer on the monocrystalline surface while forming a polycrystalline layer on the secondary surface of the substrate;

exposing the substrate to an etching gas to remove both epitaxial and polycrystalline layers from the substrate, wherein the polycrystalline layers are removed at a faster rate than the epitaxial layers;

purging the process chamber of the etching gas;

repeating the epitaxially depositing a silicon carbon layer on the monocrystalline surface, exposing the substrate to an etching gas, and purging the process chamber of the etching gas until a predetermined thickness of the silicon carbon layer is achieved;

implanting a dopant into the silicon carbon layer using a plasma immersion ion implantation process; and heating the substrate to a temperature greater than 950° C.

* * * * *